United States Patent
Chen et al.

(10) Patent No.: US 10,079,553 B1
(45) Date of Patent: Sep. 18, 2018

(54) BRIDGE RECTIFIER CIRCUIT COMPONENT

(71) Applicant: SIRECTIFIER ELECTRONIC CO., LTD., New Taipei (TW)

(72) Inventors: Wen-Pin Chen, New Taipei (TW); Kuo-Tung Lee, New Taipei (TW)

(73) Assignee: Sirectifier Electronics Co., Ltd., New Taipei (TW)

( * ) Notice: Subject to any disclaimer, the term of this patent is extended or adjusted under 35 U.S.C. 154(b) by 0 days.

(21) Appl. No.: 15/823,085

(22) Filed: Nov. 27, 2017

(51) Int. Cl.
*H02M 7/00* (2006.01)
*H01L 23/495* (2006.01)

(52) U.S. Cl.
CPC ...... *H02M 7/003* (2013.01); *H01L 23/49503* (2013.01); *H01L 23/49558* (2013.01); *H01L 23/49575* (2013.01)

(58) Field of Classification Search
CPC ............. H02M 7/003; H01L 23/49575; H01L 23/49558; H01L 23/49503
USPC ........................................................ 363/146
See application file for complete search history.

*Primary Examiner* — Kyle J Moody
(74) *Attorney, Agent, or Firm* — Muncy, Geissler, Olds & Lowe, P.C.

(57) ABSTRACT

The present disclosure illustrates an electronic component applicable single-phase or three-phase bridge rectifier circuit. The electronic component includes a lead frame, a first die, and a second die. The first and second pins of the lead frame are connected to the first and second boards respectively, and a surface of the first die opposite to the first board is connected to the second board, a surface of the second die opposite to the second board is connected a third pin of the lead frame. The bridge rectifier circuit may include two or three electronic components, and the first pins of the electronic components are connected to each other as a first DC output terminal, the third pins are electrically connected to each other as a second DC output terminal, and the second pins are served as AC input terminals, respectively.

10 Claims, 4 Drawing Sheets

BRIDGE RECTIFIER CIRCUIT COMPONENT

BACKGROUND OF THE INVENTION

1. Field of the Invention

The present disclosure relates to a bridge rectifier circuit component. More particularly, the present disclosure relates to a circuit component applied in a circuit converting AC input into DC output; more particularly, the circuit component can be applied to a single-phase bridge rectifier circuit; more particularly, the circuit component can be applied to a three-phase bridge rectifier circuit.

2. Description of the Related Art

The bridge rectifiers, which use unidirectional property of diodes for rectification, are common circuits used to convert AC power into DC power.

A conventional single-phase bridge rectifier is formed by four rectifier diodes bridged with each other. A rectifier diode includes a diode die and conductive leads packaged by insulation plastic. In the conventional single-phase bridge rectifier, anodes of the four rectifier diodes must be connected to each other, and cathodes of the four rectifier diodes must be connected to each other, and the multilayer relationship between the diodes connected in series results in a complicated structure, so the four rectifier diodes are generally packaged in a device by fully insulated package manner, there forming the single-phase bridge rectifier. For this reason, the conventional single-phase bridge rectifier has poor heat dissipation performance; furthermore, the diode die must be flipped during the die package process, so it is hard to use fully automatic processing manner to package the die, and the manufacturing process of the conventional bridge rectifier is complicated. As a result, the product consistency and reliability of the conventional bridge rectifier are not good enough.

SUMMARY OF THE INVENTION

In order to solve above-mentioned problems, the present disclosure is to provide a bridge rectifier circuit component applicable to a single-phase bridge rectifier circuit and a three-phase bridge rectifier circuit.

In an embodiment, a single-phase bridge rectifier circuit and a three-phase bridge rectifier circuit includes an in-line electronic component. The in-line electronic component includes a lead frame; a first die disposed on a first board of the lead frame; and a second die disposed on a second board of the lead frame. The first die and the second die are in contact with the carrier board by the same surfaces thereof; a first pin of the lead frame is electrically connected to the first board, a second pin of the lead frame is electrically connected to the second board, and a surface of the first die opposite to the first board is electrically connected to the second board, a surface of the second die opposite to the second board is electrically connected a third pin of the lead frame. Above-mentioned bridge rectifier circuit may include two or three electronic components, and the first pins of the electronic components are electrically connected to each other as a first DC output terminal of the bridge rectifier circuit, the third pins of the electronic components are electrically connected to each other as a second DC output terminal of the bridge rectifier circuit, and the second pins of the electronic components are served as AC input terminals of the bridge rectifier circuit, respectively. As a result, the bridge rectifier circuit component of the present disclosure has heat dissipation performance better than that of the conventional single-phase bridge rectifier formed by four rectifier diodes packaged in a chip or the conventional three-phase bridge rectifier formed by six rectifier diodes packaged in a chip, and the first die and the second die are in contact with the carrier board by the same surface thereof, that is, P-type semiconductors or N-type semiconductors of the die face upwardly at the same time, so it is not necessary to flip the die during package process. As a result, the manufacturing process of the electronic component of the present disclosure can be simpler, the manufacturing cost of the electronic component of the present disclosure can be reduced, and the production efficiency of the electronic component of the present disclosure can be improved.

DETAILED DESCRIPTION OF THE PREFERRED EMBODIMENTS

Figure 1:
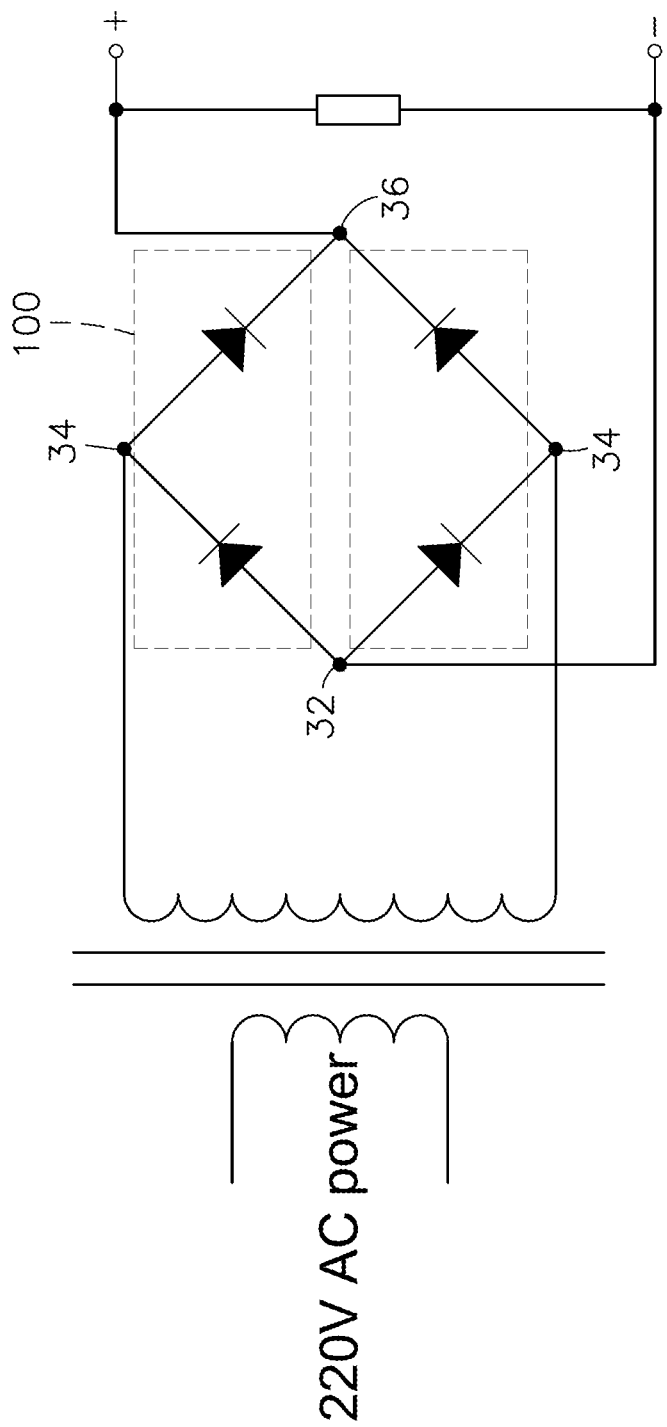
FIG. 1 is a schematic circuit diagram of a single-phase bridge rectifier circuit, in accordance with the present disclosure.
Figure 2:
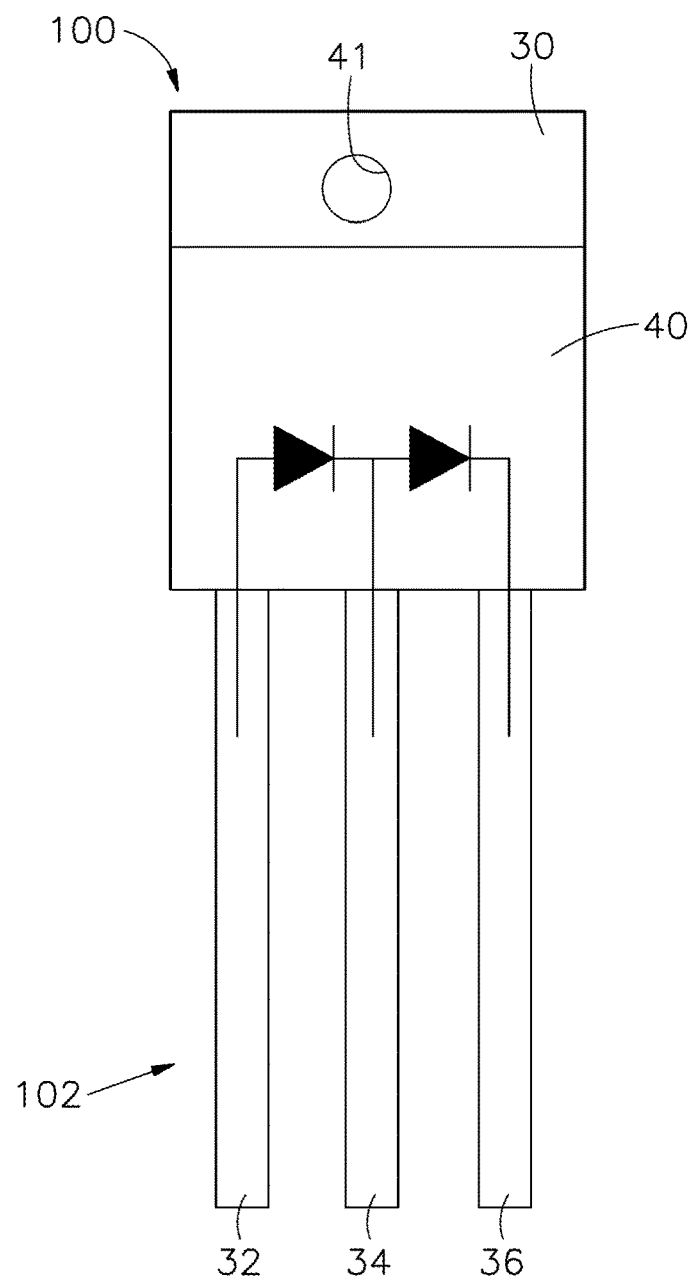
FIG. 2 is a schematic view of an electronic component of the present disclosure.
Figure 3:
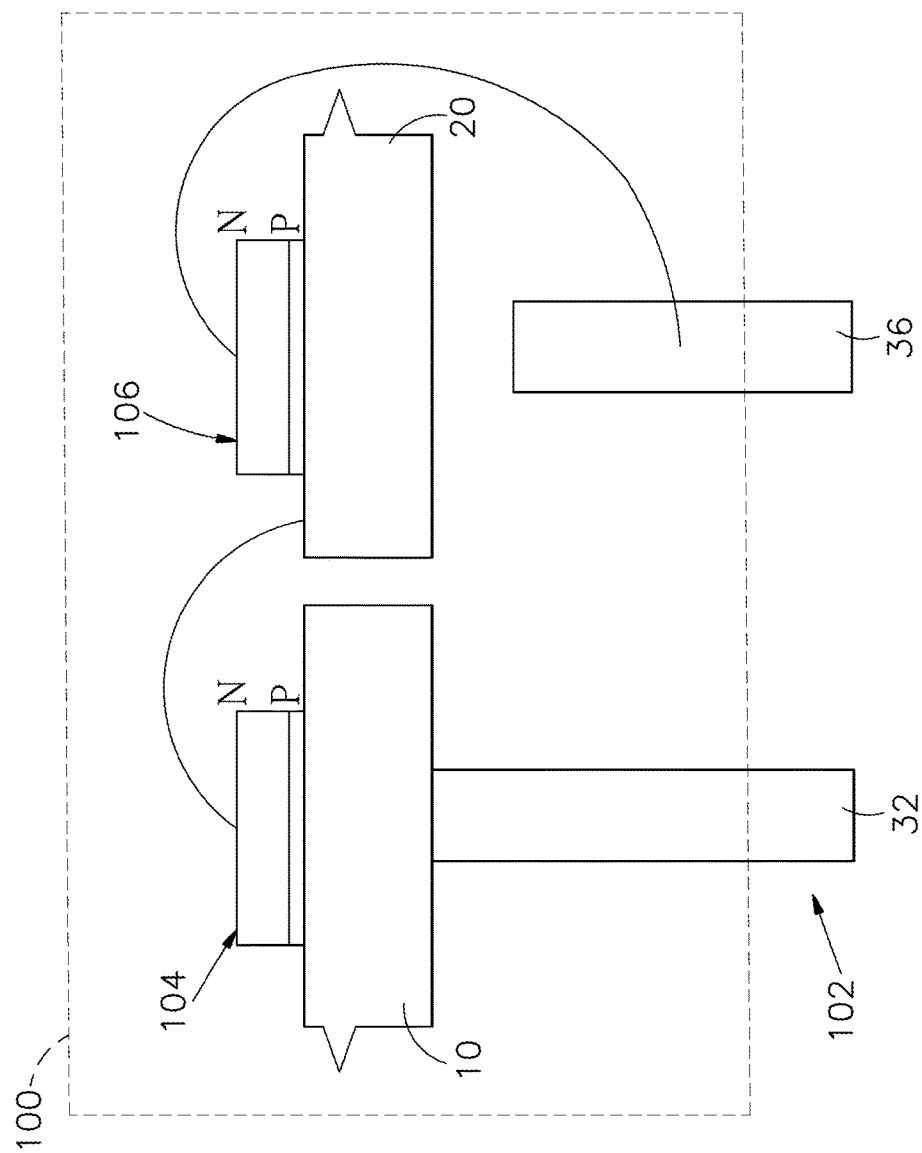
FIG. 3 is a schematic view of connection relationship between a lead frame and a die of the electronic component of the present disclosure.

Please refer to FIGS. 1 through 3, which respectively show a circuit diagram of a single-phase bridge rectifier circuit, a schematic view of an electronic component, and a schematic view of connection relationship between a lead frame and a die of the electronic component, in accordance with the present disclosure. In an embodiment, the single-phase bridge rectifier circuit includes two in-line electronic components 100. The electronic component 100 includes a lead frame 102, a first die 104, a second die 106 and an outer insulative protective layer 40.

The lead frame 102 is made of conductive material, and includes a first pin 32, a second pin 34, a third pin 36, a carrier board configured to dispose a die, and an exposed heat dissipation part 30 connected to the carrier board. The carrier board includes a first board 10, and a second board 20 insulated from the first board 10. It is to be noted that FIG. 3 is a schematic view showing a positional relationship and a connection relationship between top surfaces and back surfaces of the first die 104 and the second die 106, and the lead frames 102, so the extension directions of the first pin 32 and the second pin 34 are not the practical extension directions. The practical extension direction of the first pin 32 and the second pin 34 should be in parallel with the first die 104 and the second die 106 shown in FIG. 2, and not the direction shown in FIG. 3; furthermore, the second pin 34 connected with the second board 20 is omitted in FIG. 3.

The first die 104 is a diode die, so that the first die 104 can be served as a diode which has a top surface and a back surface with opposite polarities, and disposed on the first board 10.

The second die 106 is a diode die which has a top surface and a back surface with opposite polarities, and disposed on the second board 20. The first die 104 and the second die 106 are covered by the outer insulative protective layer 40; for this reason, the two diodes shown in FIG. 2 just schematically illustrates the locations of the first die 104 and the second die 106 on the lead frame 102.

The first die 104 and the second die 106 are in contact with the carrier board by the same surface thereof. In the embodiment shown in FIGS. 2 and 3, the back surfaces of the first die 104 and the second die 106 correspond in position to P-type semiconductors inside the dies and served as anodes of the diodes, and the top surfaces of the first die 104 and the second die 106 correspond in position to N-type semiconductor and served as cathodes of the diodes. However, in other implementations, the top surface of one of the first die 104 and the second die 106 can be served as the anode of the diode, and the back surface of one of the first die 104 and the second die 106 can be served as the cathode of the diode, and the anode of the first die 104 is in contact with the carrier board, the cathode of the second die 106 is electrically connected to the third pin 36 through a lead, and the cathode of the first die 104 is electrically connected to the second board 20 through a lead.

The first pin 32 is electrically connected to the first board 10, and the second pin 34 is electrically connected to the second board 20. A surface of the first die 104 opposite to the first board 10 is electrically connected to the second board 20, and a surface of the second die 106 opposite to the second board 20 is electrically connected to the third pin 36.

The outer insulative protective layer 40 covers the first die 104 and the second die 106, as shown in FIG. 2, the exposed heat dissipation part 30 is not covered by the outer insulative protective layer 40, thereby better performing heat dissipation for the first die 104 and the second die 106. In a preferred embodiment, the outer insulative protective layer 40 can be made of epoxy resin or other insulation plastic. In other implementations, the lead frame 102 can perform heat dissipation without using the exposed heat sink. For example, a back surface of the carrier board, or a part of the structure of the lead frame 102 which is not covered by the outer insulative protective layer 40 and other than the first pin 32, the second pin 34 and the third pin 36, can be in contact with outside air directly for heat dissipation.

Please refer to FIG. 1. the first pins 32 of the two electronic components 100 are electrically connected to each other as a first DC output terminal of the single-phase bridge rectifier circuit, and the third pins 36 of the two electronic components 100 are electrically connected to each other as a second DC output terminal of the single-phase bridge rectifier circuit, and the second pins 34 of the two electronic components 100 are served as AC input terminals of the single-phase bridge rectifier circuit, respectively.

The single-phase bridge rectifier circuit includes the two electronic components 100 which each has the exposed heat dissipation part 30 such as an exposed metal heat sink, so heat dissipation performance of such single-phase bridge rectifier circuit is better than that of the conventional single-phase bridge rectifier including four rectifier diode chips packaged in a device. Furthermore, the first die 104 and the second die 106 are in contact with the carrier board by the same surfaces thereof, that is, the P-type semiconductors of the first die 104 and the second die 106 both or the N-type semiconductors of the first die 104 and the second die 106 both face upwardly, so it is not necessary to flip the first die 104 or the second die 106 during the package process. As a result, the processing procedure can be simpler, the manufacturing cost can be reduced, and the production efficiency can be improved.

Please refer to FIG. 2. In an embodiment, the exposed heat dissipation part 30 is formed with a locking hole 41 cut therethrough, so that a fastener can be inserted through the locking hole 41 to fasten the semiconductor component on other object. Preferably, the fastener can be a screw.

In an embodiment, the first die 104 and the second die 106 of the electronic component 100 are selected from two dies adjacent to each other on a wafer. Generally, automation die bonder equipment usually picks a die from the wafer in a die arrangement order and then places the die on the lead frame 102 for die bonding, so it is easy to perform that the two dies of the electronic component 100 are selected from the two dies located adjacent to each other on the wafer. As a result, compared with the conventional single-phase bridge rectifier including four discrete rectifier diodes with poor reliability due to inconsistency between the four discrete rectifier diodes formed by dies from different wafers possibly, the single-phase bridge rectifier circuit formed by the bridge rectifier circuit component of the present disclosure can have higher consistency and better reliability.

In an embodiment, the first board 10 and the second board 20 have almost the same orthographic projection areas, so that the heat dissipation performance of the first board 10 for the first die 104 and the heat dissipation performance of the second board 20 for the second die 106 are almost the same, thereby preventing the electric property of the electronic component from varying because of the different temperatures of the first die 104 and the second die 106 during operation of the single-phase bridge rectifier circuit.

Figure 4:
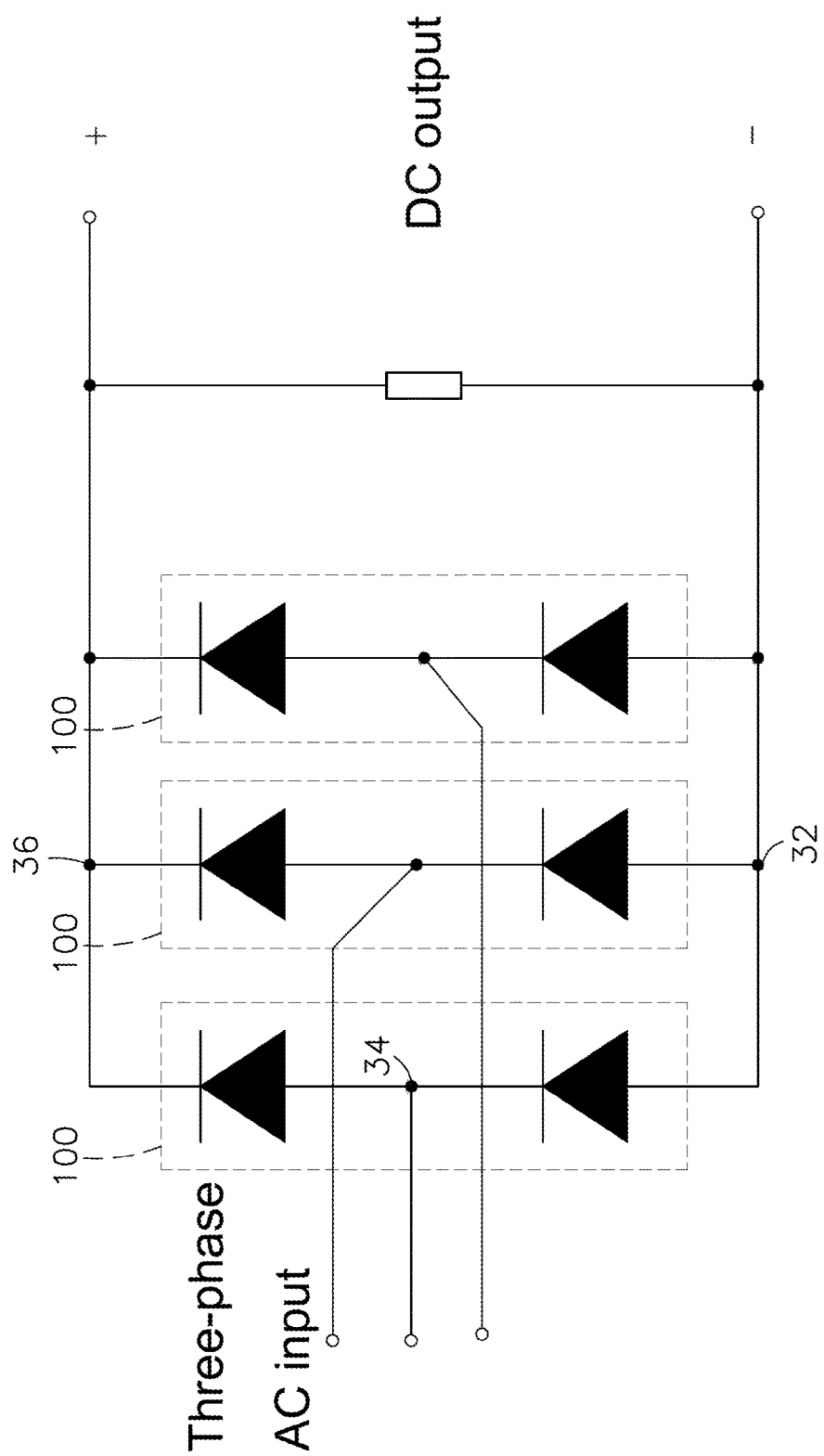
FIG. 4 is a circuit diagram of a three-phase bridge rectifier circuit, in accordance with the present disclosure.

Please refer to FIG. 4, which is a circuit diagram of a three-phase bridge rectifier circuit, in accordance of the present disclosure. In this embodiment, a three-phase bridge rectifier circuit includes three electronic components 100 which can be any one of the electronic components 100 of aforementioned embodiments. The first pins 32 of the three electronic components 100 are electrically connected to each other as a first DC output terminal of the three-phase bridge rectifier circuit, the third pins 36 of the three electronic components 100 are electrically connected to each other as a second DC output terminal of the three-phase bridge rectifier circuit, and the second pins 34 of the three electronic components 100 are served as AC input terminals of the three-phase bridge rectifier circuit, separately.

The three-phase bridge rectifier circuit includes the three electronic components 100 which each has the exposed heat dissipation part 30 such as an exposed metal heat sink, so heat dissipation performance of such three-phase bridge rectifier circuit is better than that of the conventional three-phase bridge rectifier (power module) including six rectifier diode chips packaged in a device. Furthermore, the first die 104 and the second die 106 are in contact with the carrier board by the same surfaces thereof, that is, the P-type semiconductors of the first die 104 and the second die 106 or the N-type semiconductors of the first die 104 and the second die 106 face upwardly, so it is not necessary to flip the first die 104 or the second die 106 during the package process. As a result, the processing procedure can be simpler, the manufacturing cost can be reduced, and the production efficiency can be improved.

In an embodiment, the first die 104 and the second die 106 of the electronic component 100 are the two dies located adjacent to each other on a wafer. Generally, the automation die bonder equipment usually picks a die from the wafer in a die arrangement order and then places the die on the lead frame 102 for die bonding, so it is easy to perform that the two dies of the electronic component 100 are selected from the two dies located adjacent to each other on the wafer. As a result, compared with the conventional three-phase bridge rectifier including six discrete rectifier diodes with poor reliability due to inconsistency between the six discrete rectifier diodes formed by dies from different wafers possibly, the three-phase bridge rectifier circuit formed by the bridge rectifier circuit components of the present disclosure can have higher consistency and better reliability.

The bridge rectifier circuit component of the present disclosure, which can be applied to the single-phase bridge rectifier circuit and three-phase bridge rectifier circuit, can be the in-line electronic component 100. The electronic component 100 includes the first die 104 disposed on the first board 10 of the lead frame 102, and the second die 106 disposed on the second board 20, and the first die 104 and the second die 106 are in contact with the carrier board by the same surface thereof; the first pin 32 and the second pin 34 of the lead frame 102 are electrically connected to the first board 10 and the second board 20, respectively; the surface of the first die 104 opposite to the first board 10 is electrically connected to second board 20, and the surface of the second die 106 opposite to the second board 20 is electrically connected the third pin 36; the bridge rectifier circuit includes two or three electronic components 100, and the first pins 32 and the third pins 36 of the electronic components 100 are served as the first and second DC output terminals, respectively; the second pins 34 of the electronic components 100 are served as the AC input terminals, respectively. As a result, the bridge rectifier circuit component of the present disclosure can have nice heat dissipation, simper processing procedure, lower manufacturing cost, and higher product consistency and reliability.

The present disclosure disclosed herein has been described by means of specific embodiments. However, numerous modifications, variations and enhancements can be made thereto by those skilled in the art without departing from the spirit and scope of the disclosure set forth in the claims.

What is claimed is:

1. A bridge rectifier circuit component, applicable to a single-phase bridge rectifier circuit comprising an in-line electronic component, and the in-line electronic component comprising:
   a lead frame made of conductive material, and comprising a first pin, a second pin, a third pin, and a carrier board configured to dispose a die, and said carrier board comprising a first board and a second board insulated from said first board;
   a first die which is a diode die and has a top surface and a back surface with opposite polarities, and said first die disposed on said first board;
   a second die which is a diode die and has a top surface and a back surface with opposite polarities, and said second die disposed on said second board, wherein said first die and said second die are in contact with said carrier board by the same surfaces thereof, and said first pin is electrically connected to said first board, said second pin is electrically connected to said second board, and a surface of said first die opposite to said first board is electrically connected to said second board, a surface of said second die opposite to said second board is electrically connected said third pin; and
   an outer insulative protective layer covering said first die and said second die, and not covering a partial structure of said lead frame other than said first pin, said second pin and said third pin, for heat dissipation;
   wherein the single-phase bridge rectifier circuit comprises two electronic components, and said first pins of said two electronic components are electrically connected to each other as a first DC output terminal of the single-phase bridge rectifier circuit, said third pins of said two electronic components are electrically connected to each other as a second DC output terminal of the single-phase bridge rectifier circuit, and said second pins of said two electronic components are served as AC input terminals of the single-phase bridge rectifier circuit, respectively.

2. The bridge rectifier circuit component according to claim 1, wherein said lead frame comprises an exposed heat dissipation part not covered by said outer insulative protective layer.

3. The bridge rectifier circuit component according to claim 1, wherein said first die and said second die are in contact with said carrier board through anodes thereof, a cathode of said second die is electrically connected to said third pin through a lead, and a cathode of said first die is electrically connected to said second board through a lead.

4. The bridge rectifier circuit component according to claim 1, wherein said first die and said second die of said electronic component are selected from two dies located adjacent to each other on a wafer.

5. The bridge rectifier circuit component according to claim 1, wherein said first board and said second board have substantially the same orthographic projection areas, so that heat dissipation performance of said first board for said first die and the heat dissipation performance of said second board for said second die are substantially the same.

6. A bridge rectifier circuit component, applicable to a three-phase bridge rectifier circuit comprising an in-line electronic component, and the in-line electronic component comprising:
   a lead frame made of conductive material, and comprising a first pin, a second pin, a third pin, and a carrier board configured to dispose a die, and said carrier board comprising a first board and a second board insulated from said first board;
   a first die which is a diode die and has a top surface and a back surface with opposite polarities, and said first die disposed on said first board;
   a second die which is a diode die and has a top surface and a back surface with opposite polarities, and said second die disposed on said second board, wherein said first die and said second die are in contact with said carrier board by the same surfaces thereof, and said first pin is electrically connected to said first board, said second pin is electrically connected to said second board, and a surface of said first die opposite to said first board is electrically connected to said second board, a surface of said second die opposite to said second board is electrically connected said third pin; and
   an outer insulative protective layer covering said first die and said second die, and not covering a partial structure of said lead frame other than said first pin, said second pin and said third pin, for heat dissipation;
   wherein the three-phase bridge rectifier circuit comprises three electronic components, and said first pins of said three electronic components are electrically connected to each other as a first DC output terminal of the three-phase bridge rectifier circuit, said third pins of said three electronic components are electrically connected to each other as a second DC output terminal of the three-phase bridge rectifier circuit, and said second pins of said three electronic components are served as AC input terminals of the three-phase bridge rectifier circuit, respectively.

7. The bridge rectifier circuit component according to claim 6, wherein said lead frame comprises an exposed heat dissipation part which is not covered by said outer insulative protective layer.

8. The bridge rectifier circuit component according to claim 6, wherein said first die and said second die are in contact with said carrier board through anodes thereof, a cathode of said second die is electrically connected to said third pin through a lead, and a cathode of said first die is electrically connected to said second board through a lead.

9. The bridge rectifier circuit component according to claim 6, wherein said first die and said second die of said electronic component are selected from two dies located adjacent to each other on a wafer.

10. The bridge rectifier circuit component according to claim 6, wherein orthographic projection areas of said first board and said second board are substantially the same, so that heat dissipation performance of said first board for said first die is substantially the same as that of said second board for said second die.

* * * * *